United States Patent
Tseng et al.

(10) Patent No.: US 10,580,862 B2
(45) Date of Patent: Mar. 3, 2020

(54) HIGH-VOLTAGE SEMICONDUCTOR DEVICES WITH IMPROVED EAS AND RELATED MANUFACTURING METHOD THEREOF

(71) Applicant: Leadtrend Technology Corporation, Zhubei, Hsinchu County (TW)

(72) Inventors: Wan Wen Tseng, Zhubei (TW); Jen-Hao Yeh, Zhubei (TW); Yi-Rong Tu, Zhubei (TW); Chin-Wen Hsiung, Zhubei (TW)

(73) Assignee: LEADTREND TECHNOLOGY CORPORATION, Zhubei, Hsinchu County (TW)

( * ) Notice: Subject to any disclaimer, the term of this patent is extended or adjusted under 35 U.S.C. 154(b) by 0 days.

(21) Appl. No.: 15/969,974

(22) Filed: May 3, 2018

(65) Prior Publication Data

US 2018/0323258 A1 Nov. 8, 2018

(30) Foreign Application Priority Data

May 4, 2017 (TW) .............................. 106114740 A

(51) Int. Cl.
| | | |
|---|---|---|
| *H01L 29/06* | (2006.01) | |
| *H01L 29/66* | (2006.01) | |
| *H01L 29/78* | (2006.01) | |
| *H01L 27/02* | (2006.01) | |
| *H01L 29/423* | (2006.01) | |

(52) U.S. Cl.
CPC ...... *H01L 29/0696* (2013.01); *H01L 27/0207* (2013.01); *H01L 29/0649* (2013.01); *H01L 29/66712* (2013.01); *H01L 29/7802* (2013.01); *H01L 29/7815* (2013.01); *H01L 29/4238* (2013.01)

(58) Field of Classification Search
CPC ............. H01L 29/0696; H01L 27/0266; H01L 27/0274; H01L 27/0292; H01L 27/0296
See application file for complete search history.

(56) References Cited

U.S. PATENT DOCUMENTS

| | | | | |
|---|---|---|---|---|
| 4,974,059 A | * | 11/1990 | Kinzer | ................ H01L 29/0696 257/342 |
| 5,753,529 A | * | 5/1998 | Chang | ................. H01L 23/3672 148/DIG. 135 |
| 6,870,201 B1 | * | 3/2005 | Deboy | ................ H01L 29/0634 257/170 |

* cited by examiner

*Primary Examiner* — Ermias T Woldegeorgis
(74) *Attorney, Agent, or Firm* — McClure, Qualey & Rodack, LLP

(57) ABSTRACT

A high-voltage semiconductor device has a main high-voltage switch device and a current-sense device for mirroring the current through the main high-voltage switch device. The main high-voltage switch device has a plurality of switch cells arranged to form a first array on a semiconductor substrate. Each switch cell has a first cell width. The current-sense device has a plurality of sense cells arranged to form a second array on the semiconductor substrate. Each sense cell has a second cell width larger than the first cell width. The switch cells and the sense cells share a common gate electrode and a common drain electrode.

10 Claims, 12 Drawing Sheets

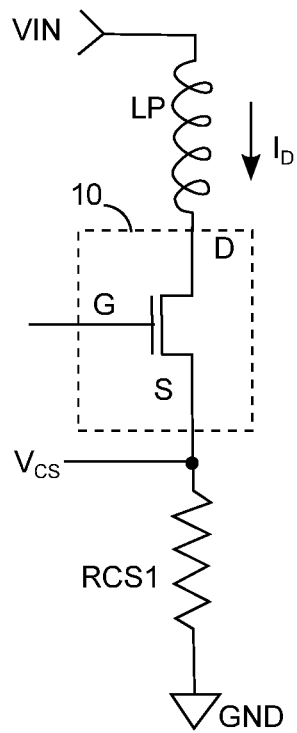
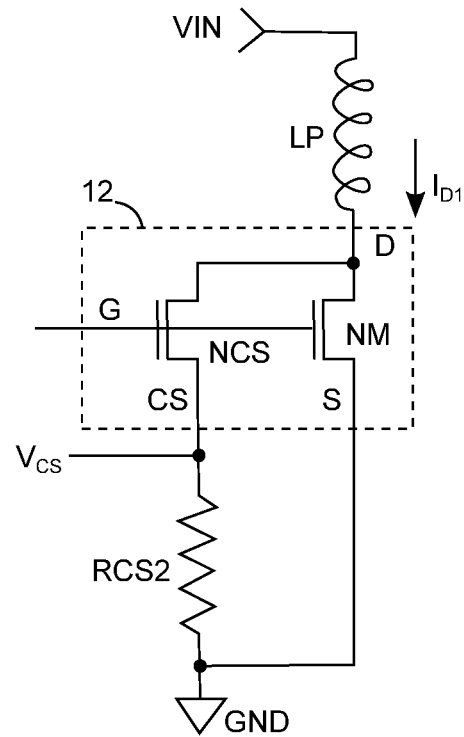
FIG. 1A (PRIOR ART)    FIG. 1B (PRIOR ART)
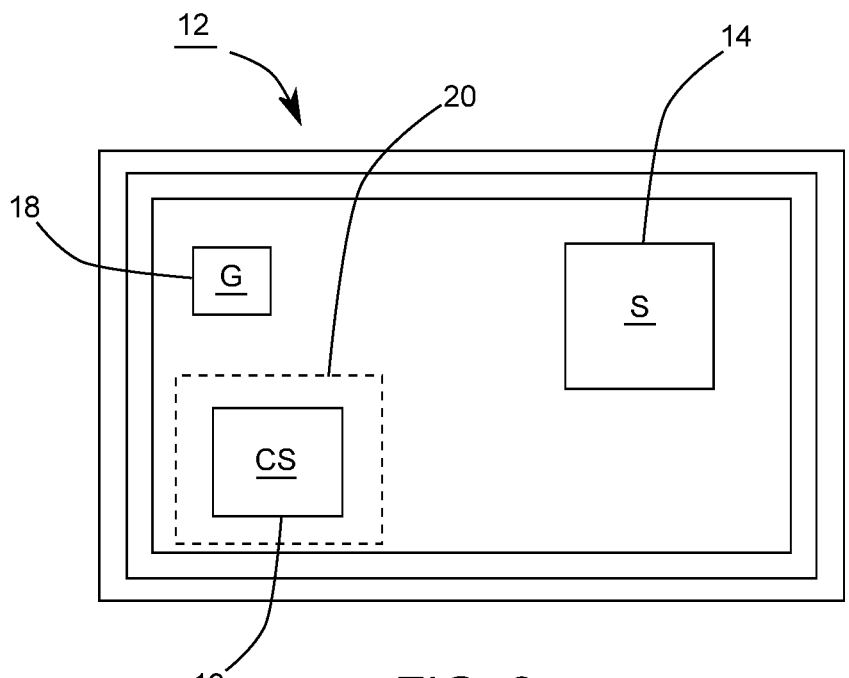
FIG. 2

HIGH-VOLTAGE SEMICONDUCTOR DEVICES WITH IMPROVED EAS AND RELATED MANUFACTURING METHOD THEREOF

CROSS-REFERENCE TO RELATED APPLICATION

This application claims priority to and the benefit of Taiwan Application Series Number 106114740 filed on Mayo, 2017, which is incorporated by reference in its entirety.

BACKGROUND

The present disclosure relates generally to high-voltage Metal-Oxide-Semiconductor Field Effect Transistors (MOSFET), and more particularly to high-voltage MOSFETs integrated with a current-sense device.

A high-voltage MOSFET refers normally to a MOSFET capable of sustaining a drain-to-source voltage higher than 5 volt. It can be used for load switch, voltage conversion in power management, or power amplification.

Some high-voltage MOSFETs, also named power switches, are intended to conduct large current. FIG. 1A shows a circuit scheme for detecting current $I_D$ flowing through inductor LP, which usually happens in power conversion applications. High-voltage MOSFET 10 has a source electrode S connected to a current-sense resistor RCS1, a terminal voltage $V_{CS}$ of which can signal a control circuit the information of current $I_D$ since voltage $V_{CS}$ accurately reflects the magnitude of current $I_D$. In FIG. 1A, all of current $I_D$ flows through current-sense resistor RCS1, which nevertheless could consume a large amount of power if current $I_D$ is huge.

FIG. 1B shows another circuit scheme for detecting current flowing through inductor LP. Integrated in high-voltage MOSFET are current-sense MOSFET NCS and main MOSFET NM, where current-sense MOSFET NCS has current-sense electrode CS connected to a ground line via current-sense resistor RCS2 but main MOSFET NM has source electrode S directly connected to a ground line. Both current-sense MOSFET NCS and main MOSFET NM are high-voltage devices. The theory of current mirroring could make the current flowing through current-sense MOSFET NCS in proportion to the current flowing through main MOSFET NM, such that voltage $V_{CS}$ output from current-sense resistor RCS2 substantially reflects current $I_{D1}$ shared by both main MOSFET NM and current-sense MOSFET NCS. Only a very little portion of current $I_D$ flows through current-sense resistor RCS2, which according consumes little power.

FIGS. 1A and 1B also imply that both high-voltage MOSFETs 10 and 12 might become breakdown during a normal operation in order to release the power accumulated by inductor LP. Taking high-voltage MOSFET 12 as an example, when it is just switched from an ON state, conducting current, to an OFF state, not-conducting current, drain electrode D of high-voltage MOSFET 12 is going to be charged by current flowing through inductor LP, and the voltage at drain electrode D could become high enough to make high-voltage MOSFET 12 avalanche breakdown. Avalanche breakdown need not necessarily damage a device though. A rating for a power switch is called EAS, referring to "Energy during Avalanche for Single pulse" and meaning the maximum power of a single pulse that the power switch can sustain without damage. The higher EAS the stronger power switch.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified. These drawings are not necessarily drawn to scale. Likewise, the relative sizes of elements illustrated by the drawings may differ from the relative sizes depicted.

The invention can be more fully understood by the subsequent detailed description and examples with references made to the accompanying drawings, wherein:

FIGS. 1A and 1B show two circuit schemes for detecting a current flowing through an inductor;

FIG. 2 demonstrates a top view of a high-voltage MOSFET;

FIGS. 14-1 to 14-6 are cross-sectional views of the high-voltage MOSFET of FIG. 1B at different stages during a process flow based on the manufacturing method of FIG. 13;

FIGS. 16-1 to 16-4 are cross-sectional views of the high-voltage MOSFET of FIG. 1B at different stages during a process flow based on the manufacturing method of FIG. 15.

DETAILED DESCRIPTION

Figures 1, 14:
Figures 2, 14:
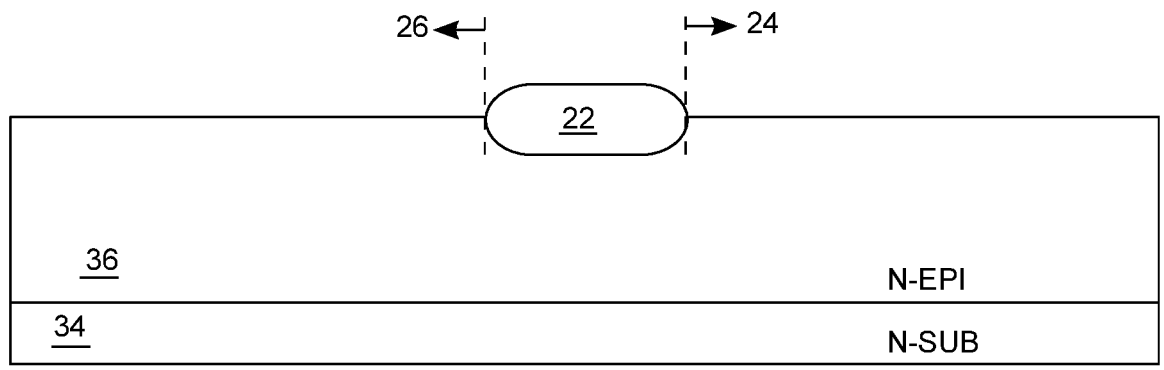
Figures 3, 14:
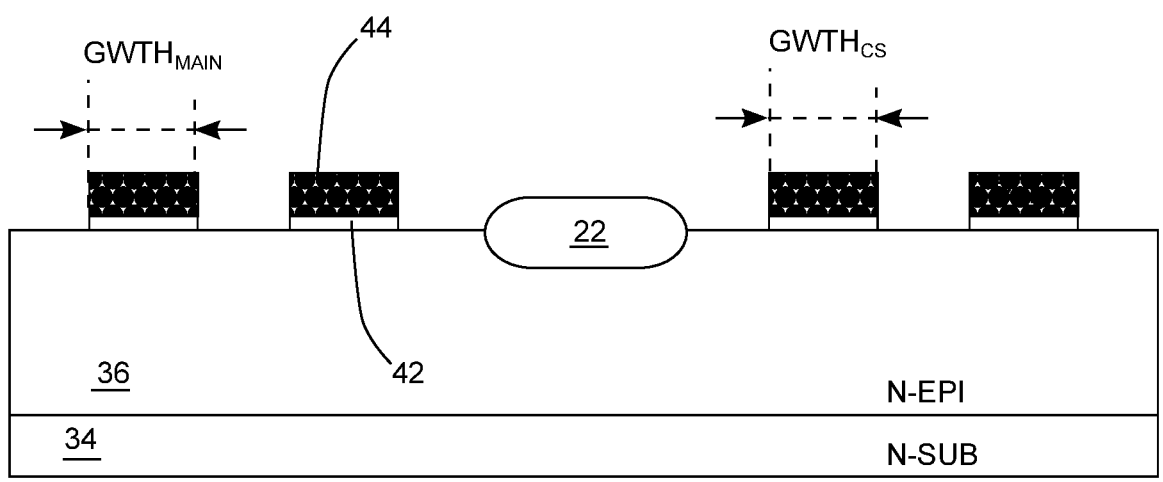
Figures 4, 14:
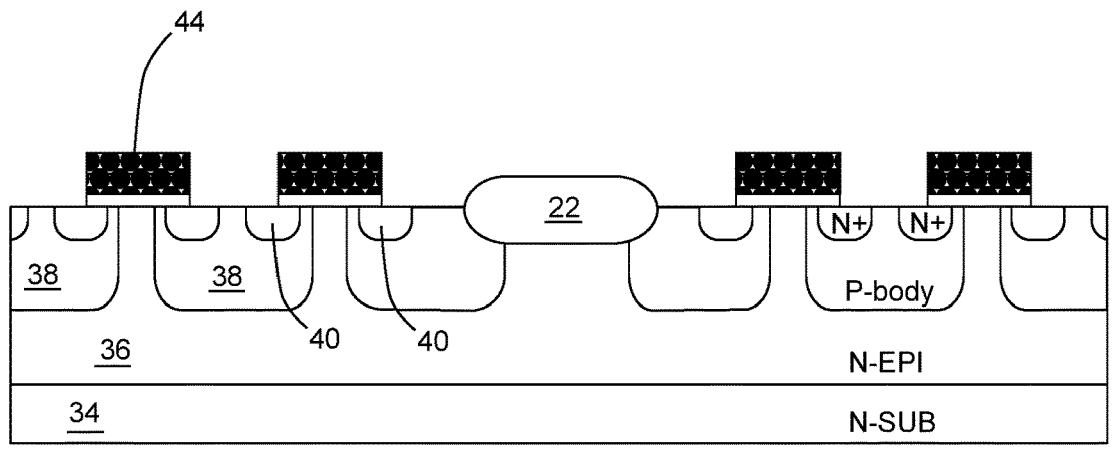
Figures 5, 14:
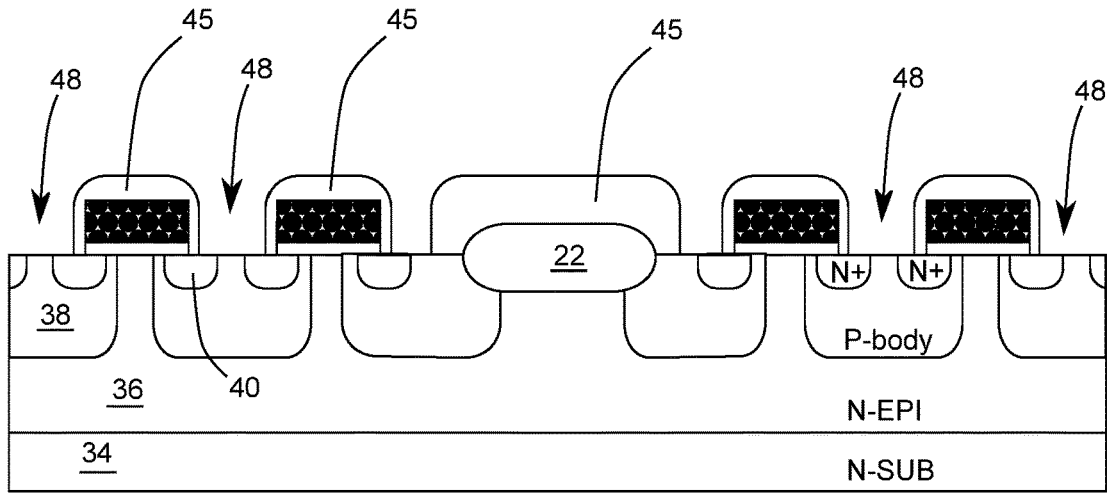
Figures 6, 14:
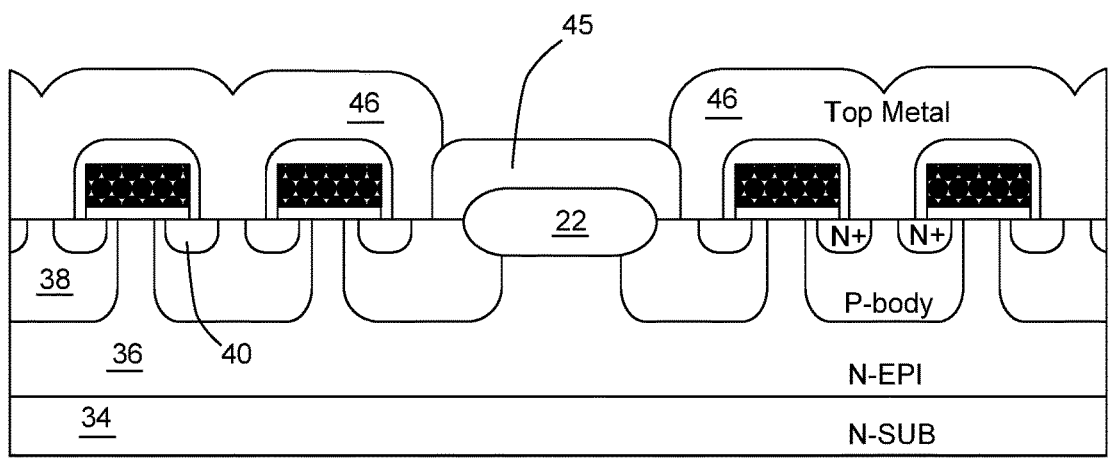

FIG. 2 demonstrates a top view of high-voltage MOSFET 12 formed on a semiconductor substrate of a semiconductor wafer. On a front of the semiconductor substrate are gate bonding pad 18, source bonding pad 14 and sense bonding pad 16, acting as gate electrode G, source electrode S and current-sense electrode CS of high-voltage MOSFET 12, respectively. A backside of the semiconductor substrate (not shown in FIG. 2) can have a backside metal layer to act as drain electrode D of high-voltage MOSFET 12.

Figure 3:
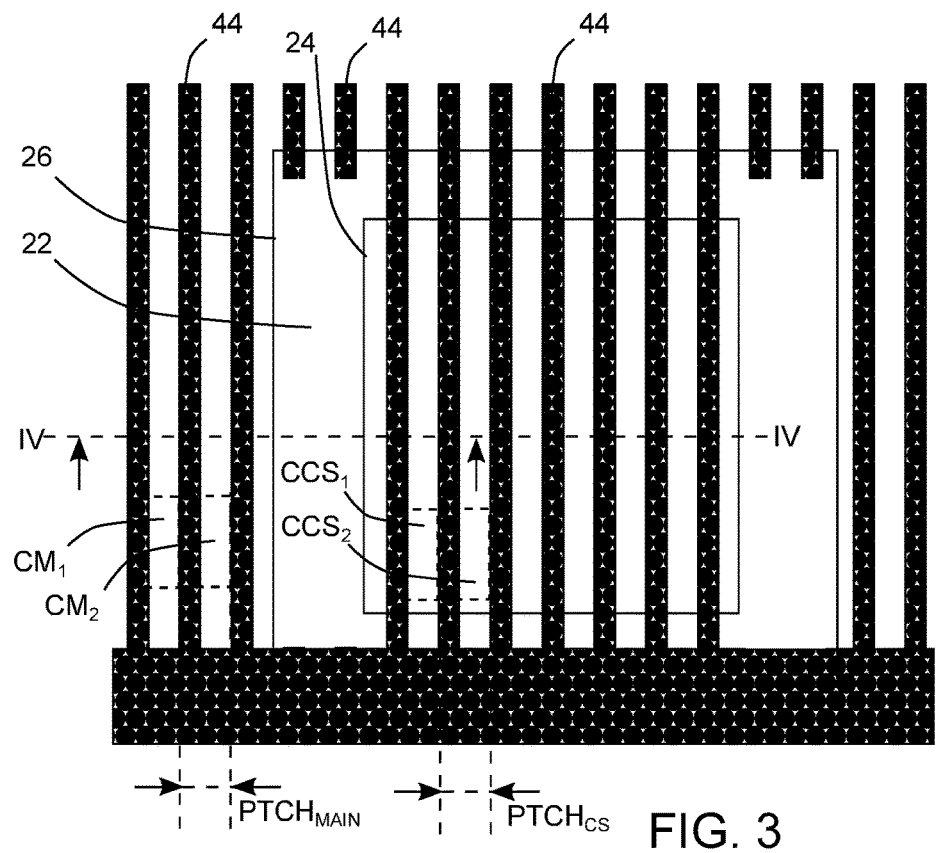
FIG. 3 details a top view of area 20 of FIG. 2.
Figure 4:
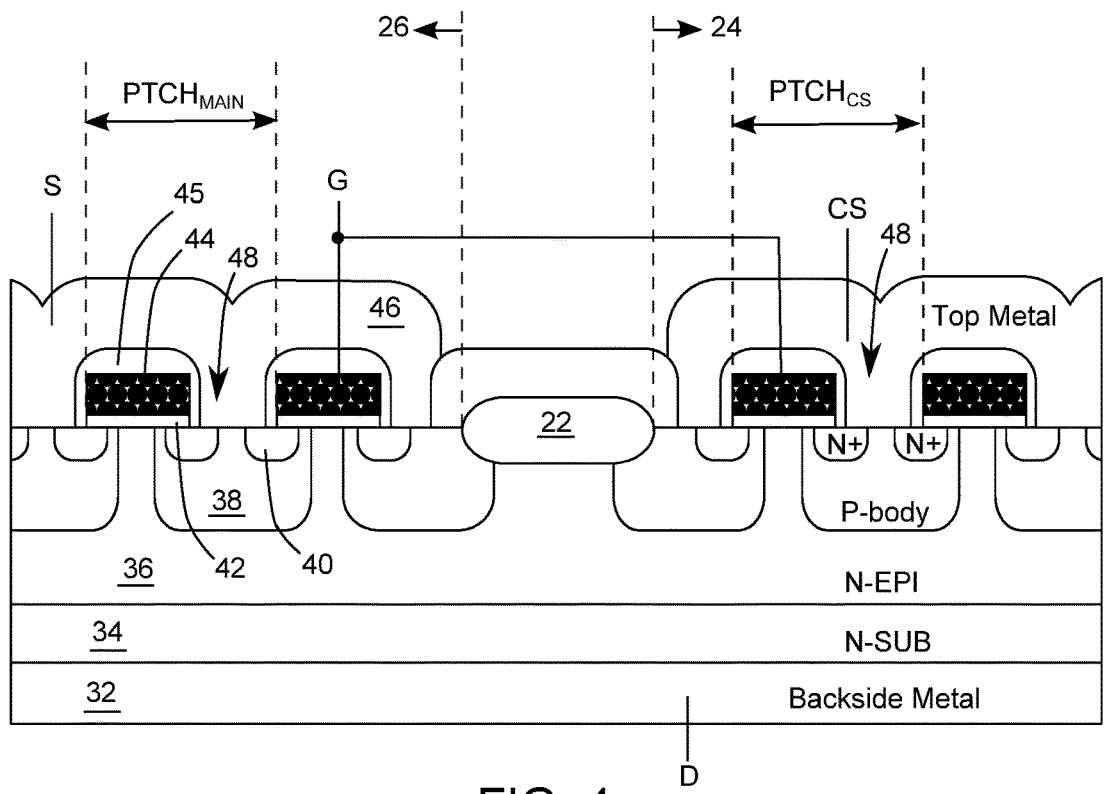
FIG. 4 shows a cross-sectional view along cutting line IV-IV in FIG. 3.

FIG. 3 details a top view of area 20 of FIG. 2, and FIG. 4 shows a cross-sectional view along cutting line IV-IV in FIG. 3.

FIG. 3 includes patterns of gate conductive layer 44 and field oxide layer 22. In FIG. 3, field oxide layer 22 surrounds CS device area 24, in which current-sense MOSFET NCS forms. The area surrounding field oxide layer 22 is referred to as main switch area 26, in which main MOSFET NM forms. Current-sense MOSFET NCS includes identical sense cells arranged to form an array, as exemplified by sense cells $CCS_1$ and $CCS_2$. Here in this specification, a cell is duplicated or mirrored several times to form an array, and two cells are identical if one is a copy or a mirror of the other. Analogously, main MOSFET NM includes identical switch cells arranged to form another array, as exemplified by switch cells $CM_1$ and $CM_2$. Each sense cell has a cell width $PTCH_{CS}$, and each switch cell has cell width $PTCH_{MAIN}$. In FIG. 3, each sense cell is the same with each switch cell, so cell width $PTCH_{MAIN}$ is equal to cell width $PTCH_{CS}$. No matter it is inside main switch area 26 or CS device area 24, the gate width of gate conductive layer 44 is the same. Simply put, main switch area 26 and CS device area 24 share the same cell to build up main MOSFET NM and current-sense MOSFET NCS respectively. Main MOSFET NM might be composed of more cells than current-sense MOSFET NCS is, so as to have higher driving force.

Each sense cell represents a high-voltage MOSFET, and so does each switch cell. All sense cells are electrically connected in a parallel scheme that their drains short, their gates short and their sources short so as to form current-sense MOSFET NCS. Analogously, all switch cells are electrically connected in the same parallel scheme that their drains short, their gates short and their sources short so as to form main MOSFET NM.

FIG. 4 illustrates backside metal layer 32, N-type semiconductor substrate 34, N-type epitaxial layer 36, P-type body region 38, N+ source region 40, gate oxide layer 42, gate conductive layer 44, inter-poly dielectric layer 45, metal layer 46, and field oxide layer 22. Gate conductive layer 44 and gate oxide layer 42 stack to form gate lines, all of which short to gate electrode G, which is a common gate electrode shared by all sense cells and switch cells. Also shown in FIG. 4 are several contact holes 48, formed by removing a portion of inter-poly dielectric layer 45. Metal layer 46 inside main switch area 26 contacts N+ source region 40 and P-type body region 38 via contact holes 48, electrically connecting to source electrode S of high-voltage MOSFET 12. The metal layer 46 inside CS device area 24 also contacts N+ source region 40 and P-type body region 38 via another contact holes 48, nevertheless connecting to current-sense electrode CS of high-voltage MOSFET 12. Backside metal layer 32 acts as a drain electrode D of high-voltage MOSFET 12, which is a common drain electrode shared by all sense cells and switch cells.

Experimental data disclose that EAS of high-voltage MOSFET 12 gains no improvement from the increment of main switch area 26 when high-voltage MOSFET 12 is implemented based on the structure shown in FIGS. 3 and 4 and CS device area 24 remains unchanged. A reasonable explanation to this phenomenon is that CS device area 24 is relatively weaker than main switch area 26. Earlier breakdown or conduction of CS device area 24 could cause most of EAS going through CS device area 24 to burn it out, such that, even though main MOSFET NM could become stronger due to the increment of main switch area 26, EAS of high-voltage MOSFET 12 obtains no benefit from that increment.

One embodiment of the invention has the cell width of each switch cell smaller than the cell width of each sense cell. Here in this specification, a contact ratio of a cell refers to the ratio of the area size of the contact hole inside the cell to the overall area size of the cell. According to one embodiment of the invention, the contact ratio of each switch cell is less than the contact ratio of each sense cell.

Embodiments of the invention make each sense cell different from each switch cell, by enlarging the cell width or the contact ratio of the sense cell, to make each sense cell less prone to breakdown or conduction during EAS tests. Accordingly, EAS could be released by switch cells instead of sense cells. Increase to number of switch cells, as it introduces more area for heat dissipation, possibly benefits EAS of the high-voltage MOSFET 12 with the sense cells and the switch cells.

Figure 5:
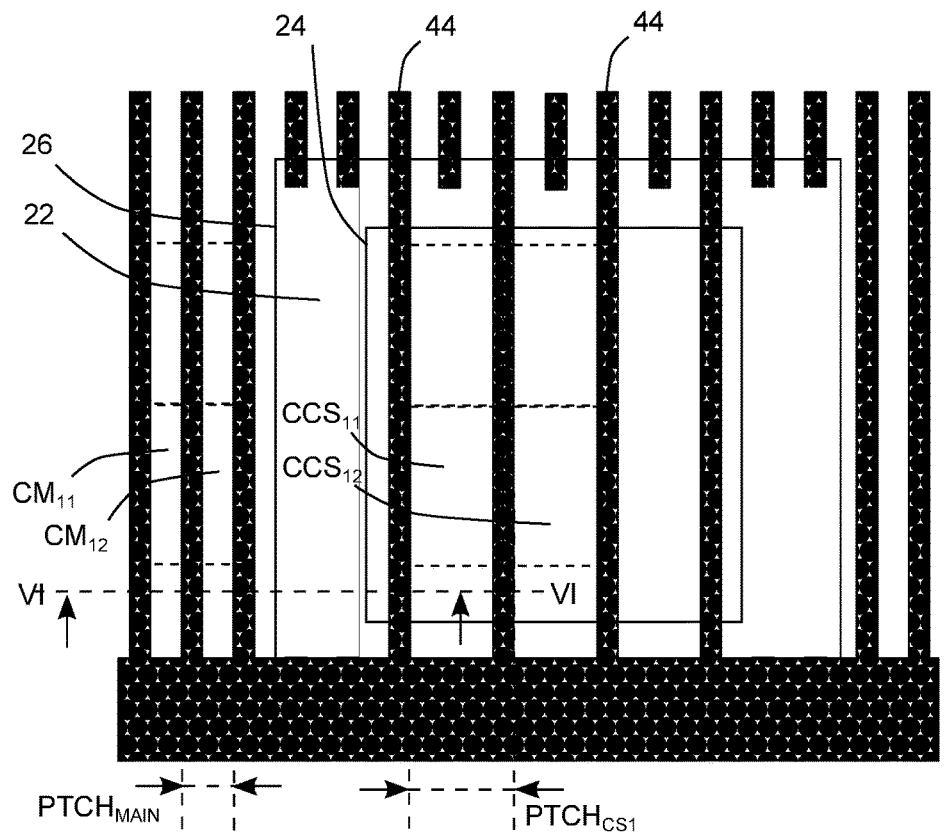
FIG. 5 demonstrates another top view of area 20 of FIG. 2 according to embodiments of the invention.
Figure 6:
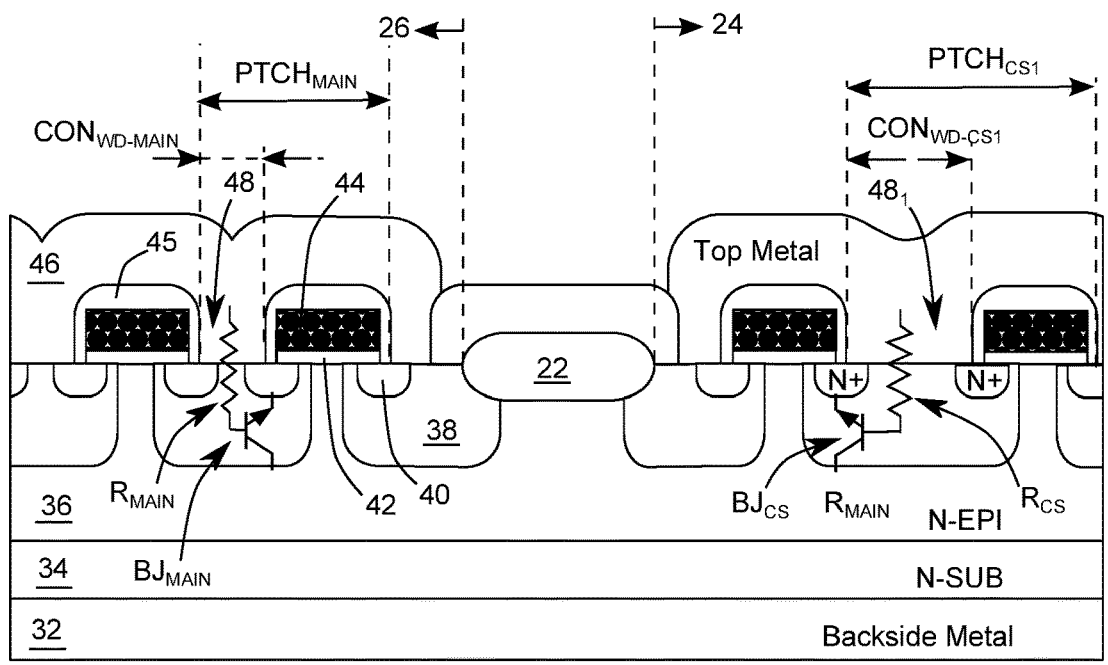
FIG. 6 a cross-sectional view along cutting line VI-VI in FIG. 5.

Based on embodiments of the invention, FIG. 5 demonstrates another top view of area 20 of FIG. 2, and FIG. 6 a cross-sectional view along cutting line VI-VI in FIG. 5.

FIG. 5 includes patterns of gate conductive layer 44 and field oxide layer 22, both formed on the front of N-type semiconductor substrate 34 as shown in FIG. 6. In FIG. 5, CS device area 24 is majorly used to form current-sense MOSFET NCS of FIG. 1B while main switch area 26 surrounding field oxide layer 22 is mainly for forming main MOSFET NM of FIG. 1B. Current-sense MOSFET NCS in FIG. 5 includes identical sense cells arranged to form an array, as exemplified by sense cells $CCS_{11}$ and $CCS_{12}$. Analogously, main MOSFET NM in FIG. 5 includes identical switch cells arranged to form another array, as exemplified by switch cells $CM_{11}$ and $CM_{12}$. Each sense cell has a cell width $PTCH_{CS1}$, and each switch cell has cell width $PTCH_{MAIN}$. In FIG. 5, each sense cell is different with each switch cell, and, more specifically, cell width $PTCH_{MAIN}$ is less than cell width $PTCH_{CS1}$. In comparison with FIG. 3, CS device area 24 in FIG. 5 are substantially the same with CS device area 24 in FIG. 3, but one gate line in CS device area 24 of FIG. 5 is skipped for every two gate lines. Therefore, cell width $PTCH_{CS1}$ is two times as long as cell width $PTCH_{MAIN}$. Embodiments might have, but are not limited to, the cell width of each sense cell an integral multiple of the cell width of each switch cell. In FIG. 5, each sense cell has about the same current-driving ability with each switch cell, for the gate width and the gate length of each sense cell are the same with them of each switch cell respectively.

FIG. 6 shows several contact holes 48 and $48_1$, formed by removing a portion of inter-poly dielectric layer 45. The metal layer 46 inside main switch area 26 contacts N+ source region 40 and P-type body region 38, both on the front of N-type semiconductor substrate 34, via contact holes 48, acting as source electrode S of high-voltage MOSFET 12. The metal layer 46 inside CS device area 24 contacts N+ source region 40 and P-type body region 38 via contact holes $48_1$, acting as current-sense electrode CS of high-voltage MOSFET 12. The width of each contact hole $48_1$, denoted as $CON_{WD\text{-}CS1}$, is larger than that of each contact hole 48, denoted as $CON_{WD\text{-}MAIN}$. Backside metal layer 32 formed on the backside of N-type semiconductor substrate 34 acts as drain electrode D of high-voltage MOSFET 12, which is a common drain electrode shared by all sense cells and switch cells. In FIG. 6, cell width $PTCH_{CS1}$ is two times longer than cell width $PTCH_{MAIN}$. The gate lines inside main switch area 26 and CS device area 24 share a common gate width, and, regardless of the area they are in, the portions of the inter-poly dielectric layer 45 covering over sidewalls of the gate lines of gate conductive layer 44 are of about the same thickness. The contact ratio of each switch cell, defined as the ratio of the area of contact hole in a switch cell to the total area of the switch cell, is about width $CON_{WD\text{-}MAIN}$ divided by cell width $PTCH_{MAIN}$. The contact ratio of each sense cell is about width $CON_{WD\text{-}CS1}$ divided by cell width $PTCH_{CS1}$. It is evidenced by FIG. 6 that the contact ratio of each switch cell is less than that of each sense cell.

FIG. 6 also demonstrates some parasitic devices. NPN bipolar junction transistor (BJT) $BJ_{MAIN}$ parasitizes in main switch area 26, consisting of N+ source region 40, P-type body region 38 and N-type epitaxial layer 36. Similarly, NPN BJT $BJ_{CS}$ parasitizes in CS device area 24, consisting of N+ source region 40, P-type body region 38 and N-type epitaxial layer 36. Resistors $R_{MAIN}$ and $R_{CS}$ refer to the equivalent resistors from the base electrodes of BJTs $BJ_{MAIN}$ and $BJ_{CS}$ to metal layer 46 respectively.

Figure 7:
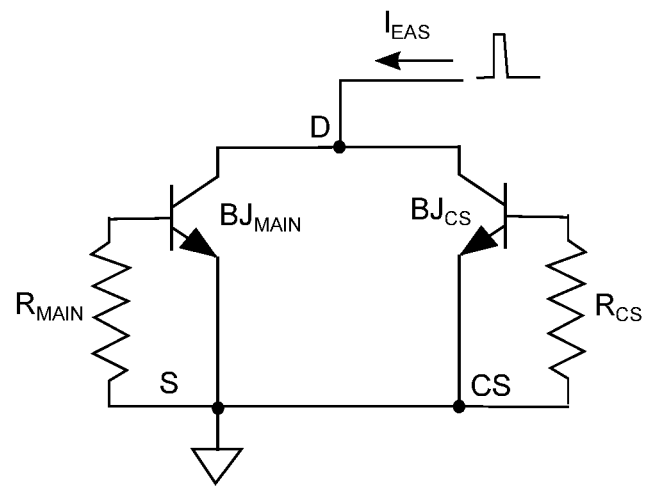
FIG. 7 demonstrates the equivalent circuit for the parasitic devices shown in FIG. 6 under EAS test.

FIG. 7 demonstrates the equivalent circuit for the parasitic devices shown in FIG. 6 under EAS test. Current $I_{EAS}$ from an external apparatus generating EAS goes to drain electrode D or backside metal layer 32. Current $I_{EAS}$ then flows through BJT $BJ_{MAIN}$ or $BJ_{CS}$, depending on which one becomes conducting earlier, and releases to ground line. The higher the resistor $R_{MAIN}/R_{CS}$, the higher the base voltage of BJT $BJ_{MAIN}/BJ_{CS}$, and the easier the BJT $BJ_{MAIN}/BJ_{CS}$ to turn ON.

Each contact hole 48 inside main switch areas 26 in FIGS. 6 and 4 have the same width $CON_{WD-MAIN}$. Width $CON_{WD-CS1}$ of each contact hole $48_1$ inside CS device area 24 of FIG. 6 are wider than that of FIG. 4. Accordingly, resistor $R_{CS}$ in FIG. 6 is surely smaller than a corresponding parasitic resistor in FIG. 4. In comparison with the sense cells in FIG. 4, the sense cells in FIG. 6 are less prone to being turned ON. If the high-voltage MOSFET in FIG. 6 is under EAS test, current $I_{EAS}$ has more possibility to be released through BJT $BJ_{MAIN}$, which is expectedly stronger since it is embodied by a relatively-large number of switch cells in main switch area 26. Therefore, EAS of the high-voltage MOSFET in FIG. 6 is expected to be better than that of the high-voltage MOSFET in FIG. 4.

Experiments evidence that if high-voltage MOSFET 12 having the top view of FIG. 3 is changed to having the top view of FIG. 5, the EAS of high-voltage MOSFET 12 improves indeed.

Figure 8:
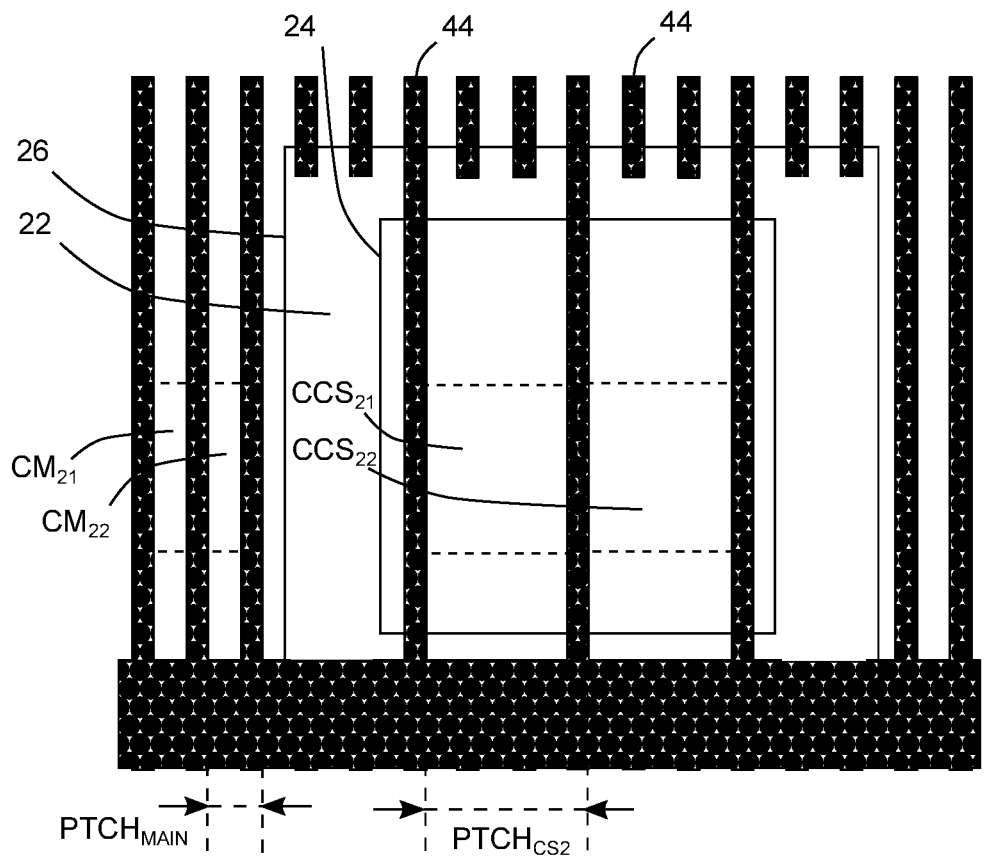
FIGS. 8 to 12 demonstrates top views of area 20 of FIG. 2 according to embodiments of the invention.

According to embodiments of the invention, FIG. 8 demonstrates another top view of area 20 of FIG. 2. FIG. 8 is similar with FIGS. 3 and 5, mainly showing patterns of gate conductive layer 44 and field oxide layer 22. In FIG. 8, CS device area 24 includes identical sense cells arranged to form an array, as exemplified by sense cells $CCS_{21}$ and $CCS_{22}$. Analogously, main switch area 26 in FIG. 8 includes identical switch cells arranged to form another array, as exemplified by switch cells $CM_{21}$ and $CM_{22}$. Each sense cell has a cell width $PTCH_{CS2}$, and each switch cell has cell width $PTCH_{MAIN}$. In comparison with FIG. 3, CS device area 24 in FIG. 8 are substantially the same with CS device area 24 in FIG. 3, but two gate lines in CS device area 24 of FIG. 8 are skipped for every three gate lines. Therefore, cell width $PTCH_{CS1}$ is three times as long as cell width $PTCH_{MAIN}$.

In FIG. 8, the gate lines inside main switch area 26 and CS device area 24 share a common gate width, and the width of a contact hole is about the gap between two adjacent gate lines. Therefore, in FIG. 8, the contact ratio of each switch cell is about the gap in each switch cell divided by cell width $PTCH_{MAIN}$, and the contact ratio of each sense cell is about the gap in each sense cell divided by cell width $PTCH_{CS2}$. It can be observed from FIG. 8 that the contact ratio of each switch cell is less than that of each sense cell.

In FIGS. 5 and 8, the switch cell in main switch area 26 is similar with the sense cell in CS device area 24 in view of their device structures and outlines. Each of the switch cell and the sense cell in FIG. 5 or 8 has an outline of rectangle, and each gate line of the switch cell and the sense cell in FIG. 5 or 8 extends vertically, for example. This invention is not limited to however. It is unnecessary for this invention to have each switch cell similar with each sense cell.

Figure 9:
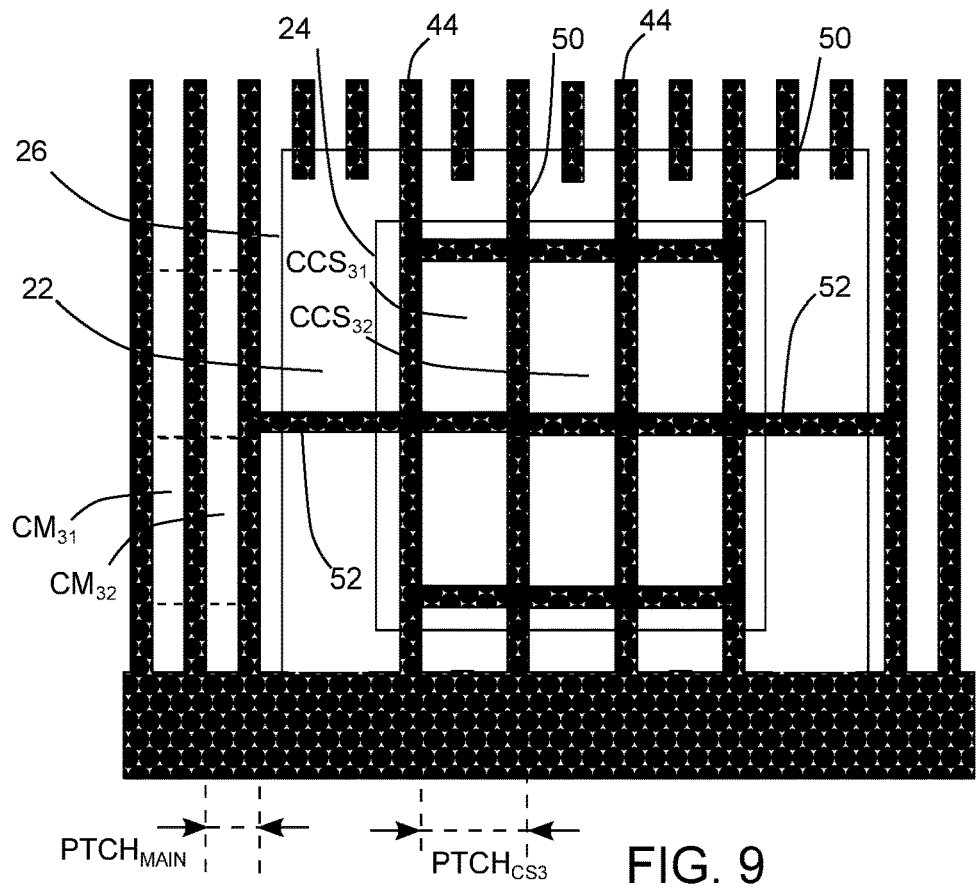

FIG. 9 demonstrates another top view of area 20 of FIG. 2 according to embodiments of the invention. In FIG. 9, CS device area 24 includes identical sense cells arranged to form an array, as exemplified by sense cells $CCS_{31}$ and $CCS_{32}$. Analogously, main switch area 26 in FIG. 9 includes identical switch cells arranged to form another array, as exemplified by switch cells $CM_{31}$ and $CM_{32}$. Each sense cell has a cell width $PTCH_{CS3}$, and each switch cell has cell width $PTCH_{MAIN}$. Cell width $PTCH_{CS3}$ is two times as long as cell width $PTCH_{MAIN}$. FIG. 9 also demonstrates that the contact ratio of each switch cell inside main switch area 26 is less than that of each sense cell inside CS device area 24.

Each of sense cells and switch cells in FIG. 9 are rectangular in view of their outlines. As shown in FIG. 9, each gate line in inside main switch area 26 extends vertically, but some gate lines inside CS device area 24 extend vertically while the others do horizontally. In FIG. 9, gate conductive layer 44 forms a gate pattern in main switch area 26 and another gate pattern in CS device area 24, and obviously these two gate patterns are different. Vertical gate lines 50 and horizontal gate lines 52 connect the gate pattern in main switch area 26 to the gate pattern in CS device area 24.

Figure 10:
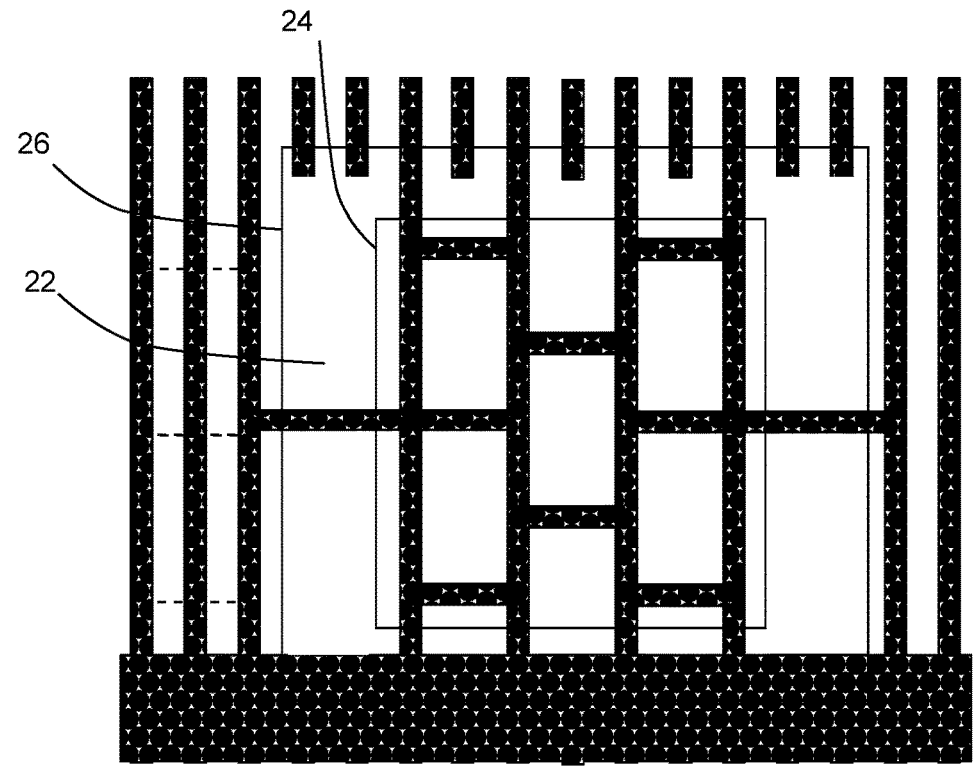

FIG. 10 demonstrates another top view of area 20 of FIG. 2 according to embodiments of the invention. FIG. 10 differs from FIG. 9 in the number and the arrangement of sense cells inside CS device area 24. FIG. 9 shows six sense cells arranged to form an array with 3 rows and 2 columns. In FIG. 10, five sense cells are arranged to form an H-shaped array.

Figure 11:
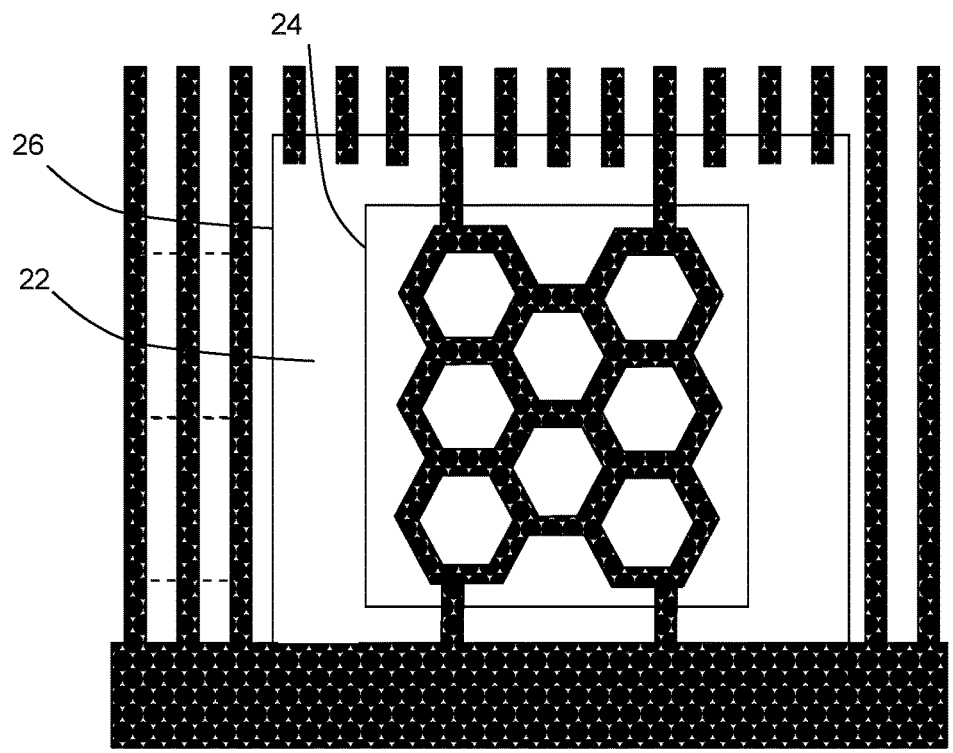

FIG. 11 demonstrates another top view of area 20 of FIG. 2 according to embodiments of the invention. In FIG. 11, the outline of each switch cell in main switch area 26 is a rectangle while the outline of each sense cell in CS device area 24 is a perfect hexagon. In FIG. 11, the contact ratio of each switch cell is less than that of each sense cell.

Figure 12:
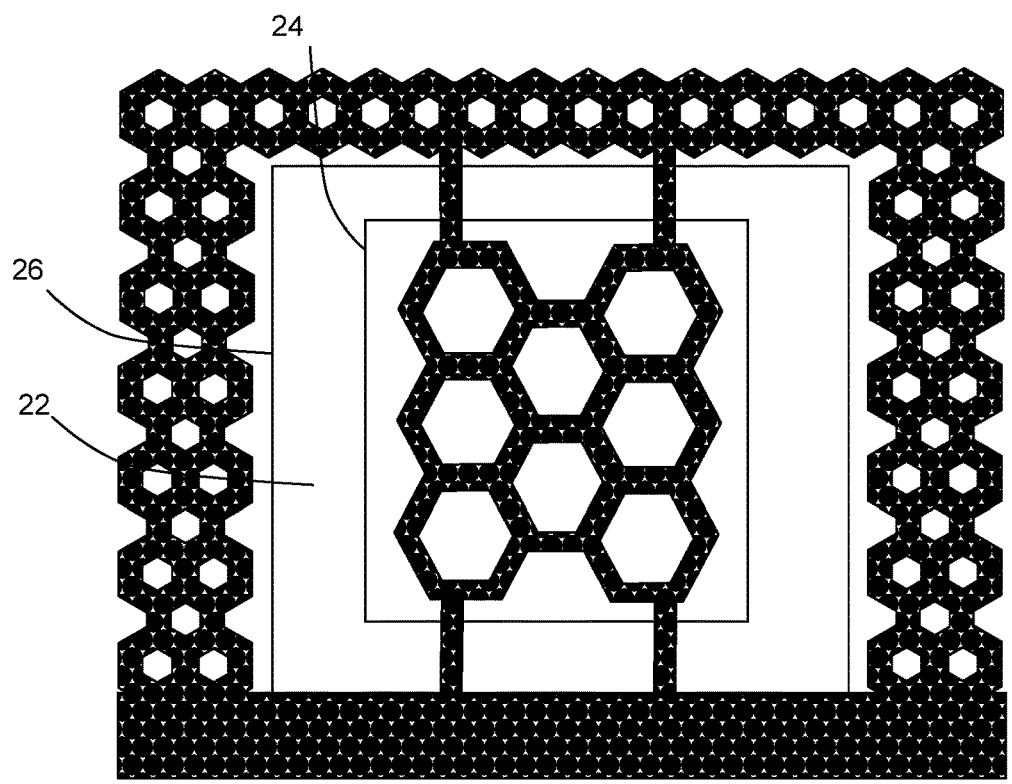

FIG. 12 demonstrates another top view of area 20 of FIG. 2 according to embodiments of the invention. In FIG. 12, the outline of each switch cell in main switch area 26 is a perfect hexagon while the outline of each sense cell in CS device area 24 is another. The perfect hexagon of each switch cell is smaller than that of each sense cell, nevertheless. All gate lines in main switch area 26 and CS device area 24 share a common gate width. Therefore, the contact ratio of each switch cell is less than that of each sense cell in FIG. 12.

Figure 13:
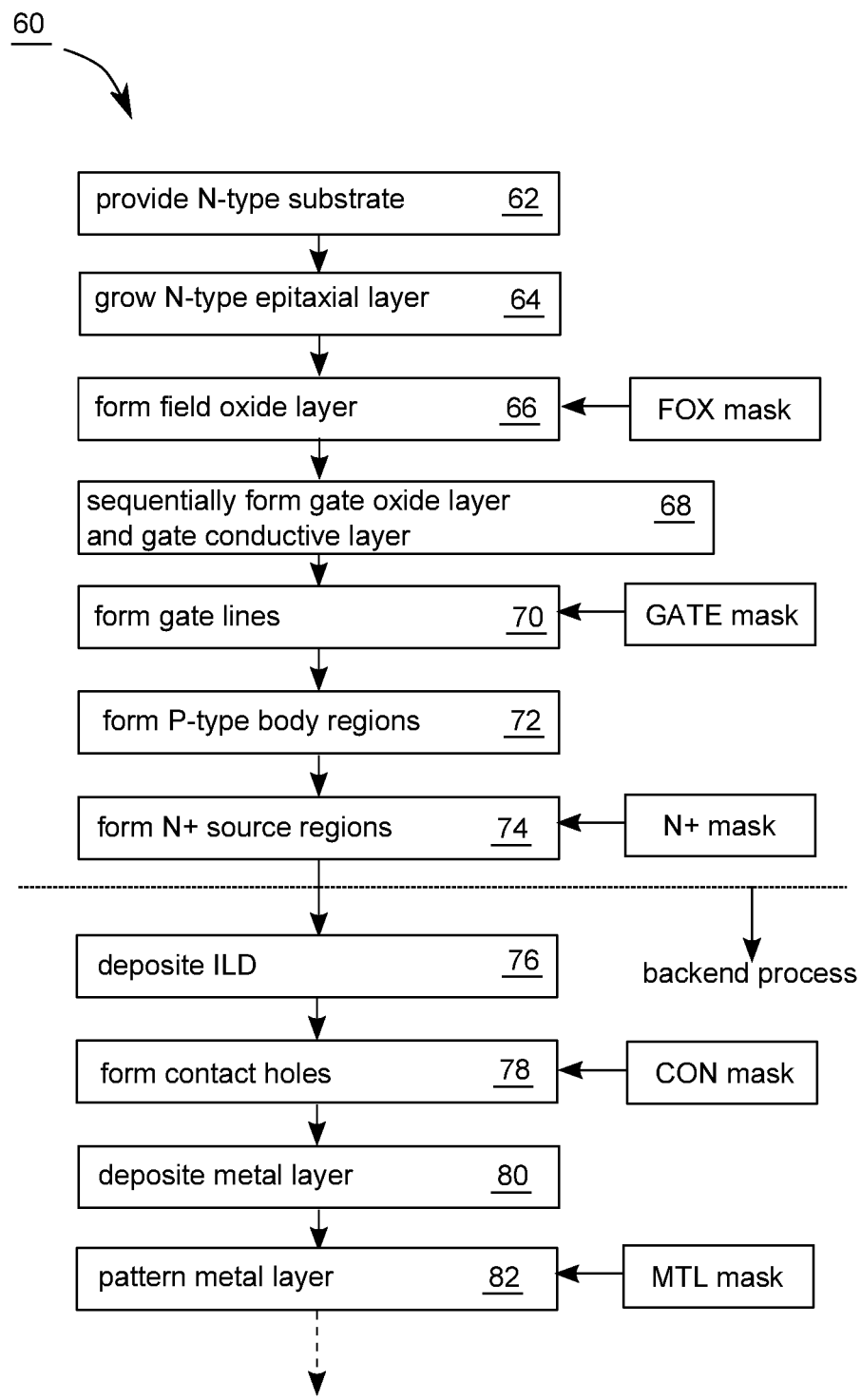
FIG. 13 shows a manufacturing method for producing the high-voltage MOSFET of FIG. 1B on a semiconductor substrate.

FIG. 13 shows manufacturing method 60 for producing high-voltage MOSFET 12 of FIG. 1B on a semiconductor substrate, and the cross-sectional views in FIGS. 4 and 6 are two possible outcomes of manufacturing method 60. FIGS. 14-1 to 14-6 are cross-sectional views of high-voltage MOSFET 12 at different stages during a process flow based on manufacturing method 60.

Manufacturing method 60 starts at step 62, providing N-type semiconductor substrate 34.

Step 64, following step 62, grows N-type epitaxial layer 36 on N-type semiconductor substrate 34 byway of an epitaxial growth process, as demonstrated in FIG. 14-1.

Step 66 forms on N-type epitaxial layer 36 a patterned field oxide layer 22, as shown in FIG. 14-2. For example, a lithographic process using a photo mask, referred to as a FOX mask in this specification, defines isolation regions that field oxide layer 22 locates and active regions where active devices are formed. As field oxide layer 36 is formed, step 66 also defines main switch area 26 and CS device area 24, as shown in FIG. 14-2.

Step 68, following step 66, sequentially forms gate oxide layer 42 and gate conductive layer 44, stacking on N-type epitaxial layer 36 and field oxide layer 22. Gate conductive layer 44 might include a poly-silicon layer.

Step 70 patterns gate conductive layer 44 and gate oxide layer 42, producing a cross-sectional view shown in FIG. 14-3. Step 70 uses a lithographic process with a photo mask, referred to as a GATE mask in this specification, to define reserve areas and unwanted areas. Portions of gate conductive layer 44 and gate oxide layer 42 within unwanted areas are removed by an etching process, so the rest of gate conductive layer 44 becomes gate lines or Gate electrode G. According to embodiments of the invention, gate width $GWTH_{MAIN}$ for each gate line in main switch area 26 is the same with gate width $GWTH_{CS}$ for each gate line in CS device area 24.

Step 72 uses gate conductive layer 44 and field oxide layer 22 as a hard mask to perform a doping process, so as to form P-type body regions 38 on N-type epitaxial layer 36. Step 72 does not use an extra photo mask. The doping process includes for example ion implantation first and impurity diffusion second, to make a portion of P-type body regions 38 covered by gate conductive layer 44.

Step 74 follows step 72 and forms N+ source regions 40 on N-type epitaxial layer 36 using lithographic and doping processes. FIG. 14-4 demonstrate a cross-sectional view produced after step 74. The lithographic process employed in step 74 uses a photo mask, referred to as an N+ mask in this specification. Two N+ source regions 40 are formed between every two neighboring gate lines, while each N+ source region 40 has an edge defined by a gate line. N+ mask defines the space between the two N+ source regions 40 clamped by two neighboring gate lines. The space between the two N+ source regions 40 exposes a portion of P-type body region 38, as shown in FIG. 14-4.

Step 76 forms on gate conductive layer 44 and N-type epitaxial layer 36 inter-poly dielectric layer 45 by for example a deposition process, and inter-poly dielectric layer 45 is made of silicon dioxide for example.

Step 78 uses a photo mask, referred to as a CON mask in this specification, to perform lithographic and etching processes, so as to remove portions of inter-poly dielectric layer 45 and to from contact holes 48. FIG. 14-5 demonstrate a cross-sectional view produced after step 78. In FIG. 14-5, each contact hold 48 has a bottom composed of body region 38 and N+ source region 40, and two sidewalls composed of inter-poly dielectric layer 45.

Step 80 is a deposition process, forming on inter-poly dielectric layer 45 and inside contact holes 48 metal layer 46, which touches N+ source regions 40 and body regions 38 to form ohmic contacts.

Step 82 patterns metal layer 46, using a lithographic process with a photo mask, referred to as a MTL mask, and an etching process to remove unwanted portions of metal layer 46. FIG. 14-6 demonstrate a cross-sectional view produced after step 82.

After step 82, backside metal layer 32 is formed on a backside of N-type semiconductor substrate 34, to generate the cross-sectional view shown in FIG. 4 or 6.

Manufacturing method 60 in FIG. 13 requires at least five photo masks, including FOX mask, GATE mask, N+ mask, CON mask and MTL mask.

Figure 15:
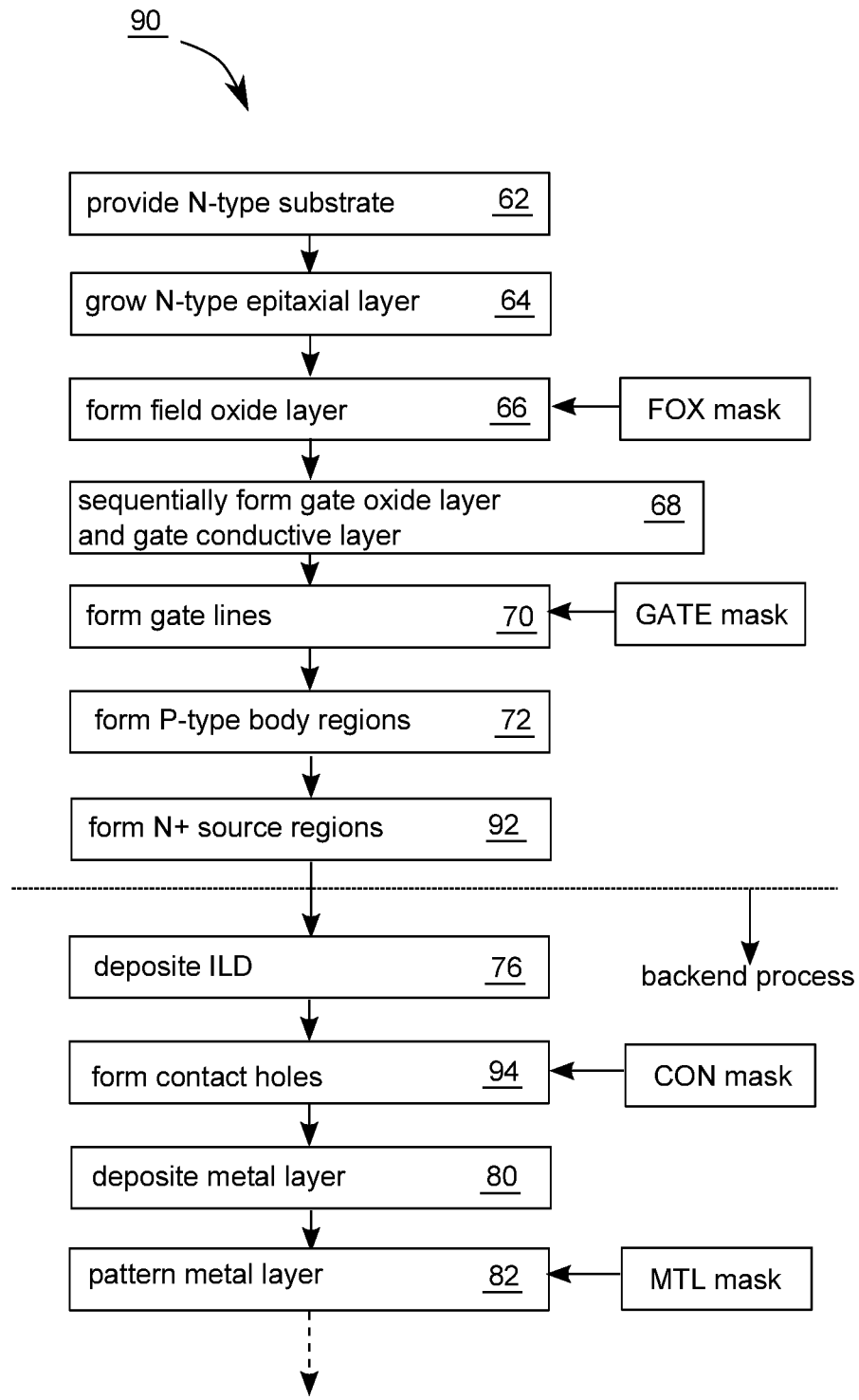
FIG. 15 shows a manufacturing method according to embodiments of the invention.
Figures 1, 16:
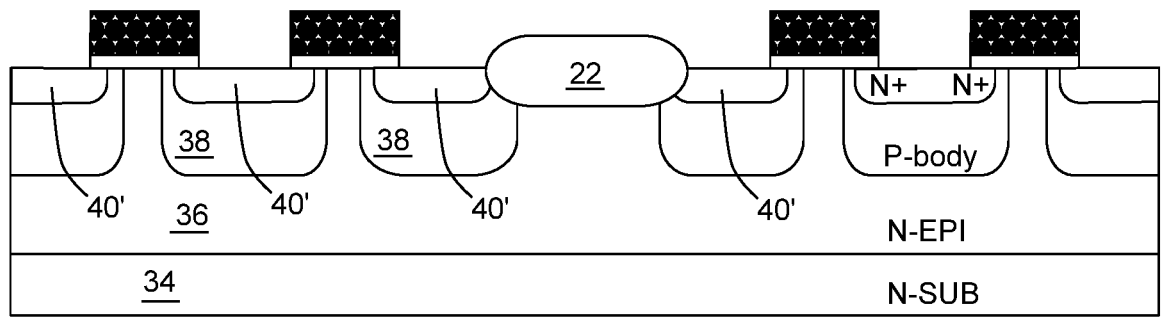
Figures 2, 16:
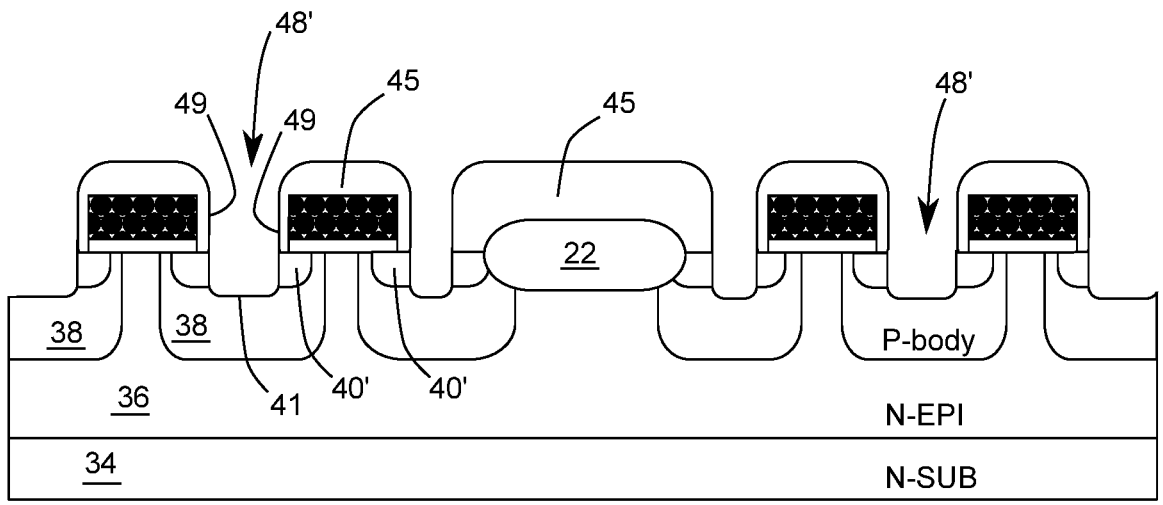
Figures 3, 16:
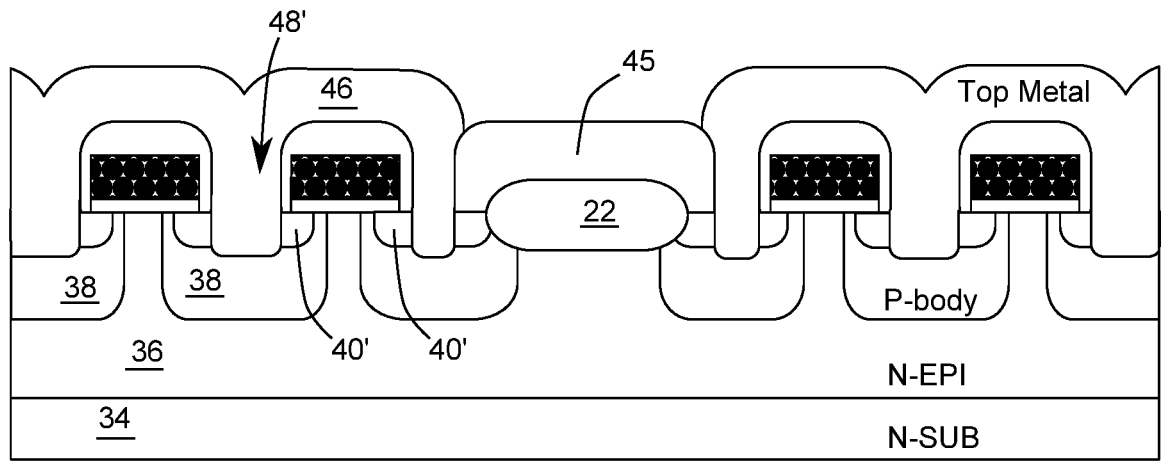
Figures 4, 16:
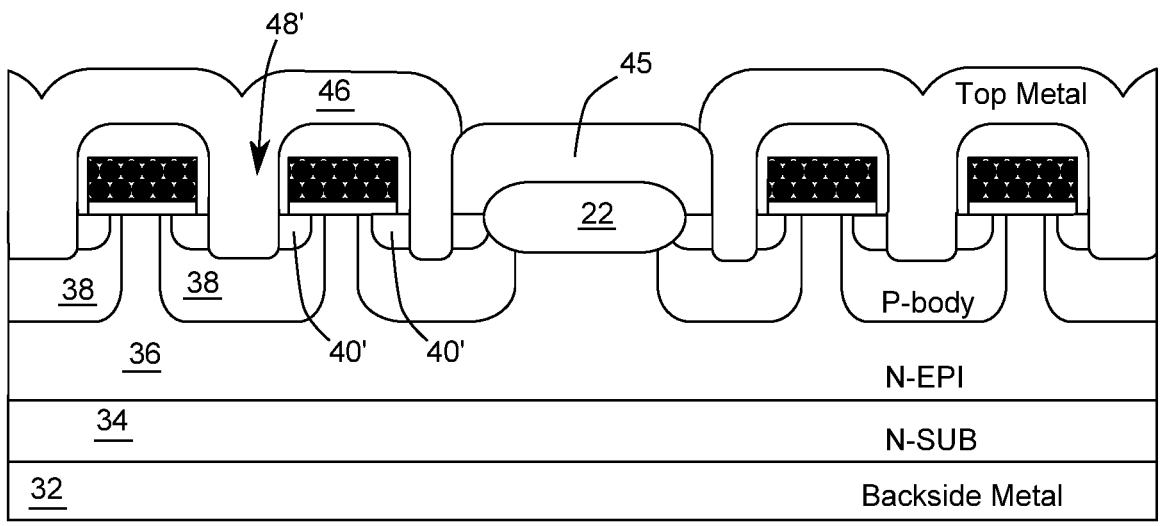

FIG. 15 shows manufacturing method 90 according to embodiments of the invention. Manufacturing method 90 is capable of producing high-voltage MOSFET 12 of FIG. 1B on a semiconductor substrate, and one possible outcome of manufacturing method 90 is shown by the cross-sectional view in FIG. 16-4. FIGS. 16-1 to 16-3 are cross-sectional views of high-voltage MOSFET 12 at different stages during a process flow based on manufacturing method 90. The total number of photo masks required by manufacturing method 90 (in FIG. 15) could be one less than that required by manufacturing method 60 (in FIG. 13).

Steps 62, 64, 66, 68, 70 and 72 in FIG. 15 can be understood based on the aforementioned teaching regarding to FIG. 13, and are not redundantly detailed herein.

Step 92 in FIG. 15 follows step 72, using gate conductive layer 44 and field oxide layer 22 as a hard mask to perform a doping or implantation process and to form N+ source regions 40' on N-type epitaxial layer 36. The cross-sectional view in FIG. 16-1 shows one possible outcome of step 92. Step 92 needs no photo mask and shares with step 72 a common hard mask. Accordingly, P-type body regions 38 and N+ source regions 40' are of about the same locations since they are all defined by a common hard mask. In a subsequent thermal process, P-type body regions 38 diffuses farther than N+ source regions 40', and each P-type body region 38 becomes a bowl containing one corresponding N+ source region 40' as shown in FIG. 16-1. Please also note in FIG. 16-1 that there is only one N+ source region 40' between two adjacent gate lines formed by patterned gate conductive layer 44.

Step 76 in FIG. 15 follows step 92, and its explanation can be found from the aforementioned teaching regarding to step 76 in FIG. 13.

Step 94 in FIG. 15 follows step 76, using CON mask to perform lithographic and etching processes, so as to remove portions of inter-poly dielectric layer 45 and N+ source regions 40' and to from contact holes 48', as demonstrated by FIG. 16-2. In FIG. 16-2, each contact hold 48' has a bottom 41 solely composed of P-type body region 38, and two sidewalls 49 composed of inter-poly dielectric layer 45 and N+ source regions 40'. The single N+ source region 40' between two adjacent gate lines in FIG. 16-1 is partially removed or consumed by step 94, so it becomes two separate N+ source regions 40' between two adjacent gate lines, as shown in FIG. 16-2.

Step 80 in FIG. 15 is a deposition process, forming on inter-poly dielectric layer 45 and inside contact holes 48' metal layer 46, which touches N+ source regions 40' and body regions 38 to form ohmic contacts.

Step 82 in FIG. 15 patterns metal layer 46 using a lithographic process with MTL mask, and could result in the cross-sectional view shown in FIG. 16-3.

After step 82 in FIG. 15, backside metal layer 32 is formed on a backside of N-type semiconductor substrate 34, to generate the cross-sectional view shown in FIG. 16-4.

Manufacturing method 90 in FIG. 15 requires at least four photo masks, including FOX mask, GATE mask, CON mask and MTL mask, but omits N+ mask used by step 74 in manufacturing method 60. Manufacturing method 90, in comparison with manufacturing method 60, seems more cost-effective because it needs less photo masks.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high-voltage semiconductor device with improved EAS, comprising:
a main high-voltage switch device, comprising:
a plurality of switch cells, arranged to form a first array on a semiconductor substrate, wherein each switch cell has a first cell width; and
a current-sense device, comprising:
a plurality of sense cells, arranged to form a second array on the semiconductor substrate, wherein each sense cell has a second cell width larger than the first cell width;
wherein the switch cells and the sense cells share a common gate electrode and a common drain electrode.

2. The high-voltage semiconductor device as claimed in claim 1, wherein the second cell width is an integral multiple of the first cell width.

3. The high-voltage semiconductor device as claimed in claim 1, wherein each switch cell has a first gate width, and each sense cell has a second gate width substantially equal to the first gate width.

4. The high-voltage semiconductor device as claimed in claim 1, wherein the main high-voltage switch device and the current-sense device share a common drain electrode formed on a backside of the semiconductor substrate, the main high-voltage switch device and the current-sense device share the common gate electrode from on a front of the semiconductor substrate, and the main high-voltage switch device and the current-sense device respectively have a source electrode and a sense electrode, both on the front.

5. The high-voltage semiconductor device as claimed in claim 1, wherein each switch cell has a first contact hole width, and each sense cell has a second contact hole width larger than the first contact hole width.

6. A high-voltage semiconductor device with improved EAS, comprising:
a main high-voltage switch device, comprising:
a plurality of switch cells, arranged to form a first array on a semiconductor substrate, wherein each switch cell has a first contact ratio; and
a current-sense device, comprising:
a plurality of sense cells, arranged to form a second array on the semiconductor substrate, wherein each sense cell has a second contact ratio larger than the first contact ratio;
wherein the switch cells and the sense cells share a common gate electrode and a common drain electrode.

7. The high-voltage semiconductor device as claimed in claim 6, wherein each switch cell has a first outline, and each sense cell has a second outline with the same geometric shape of the first outline.

8. The high-voltage semiconductor device as claimed in claim 6, wherein each switch cell has a first outline, each sense cell has a second outline, and the first outline and the second outline are different in geometric shape.

9. The high-voltage semiconductor device as claimed in claim 6, wherein the main high-voltage switch device and the current-sense device include first and second gate patterns respectively, and the first and second gate patterns are connected to each other via two gate lines not parallel to each.

10. The high-voltage semiconductor device as claimed in claim 6, wherein each sense cell has an outline, and the outline is a rectangular or a perfect hexagon.

* * * * *